United States Patent
Kim

(10) Patent No.: US 7,821,857 B2
(45) Date of Patent: Oct. 26, 2010

(54) INPUT/OUTPUT LINE SENSE AMPLIFIER AND SEMICONDUCTOR MEMORY DEVICE USING THE SAME

(75) Inventor: Chang-Il Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/586,752

(22) Filed: Sep. 28, 2009

(65) Prior Publication Data

US 2010/0020626 A1    Jan. 28, 2010

Related U.S. Application Data

(62) Division of application No. 12/004,228, filed on Dec. 20, 2007, now Pat. No. 7,616,511.

(30) Foreign Application Priority Data

Jun. 25, 2007    (KR) .................... 10-2007-0062548

(51) Int. Cl.
    *G11C 7/00*    (2006.01)
(52) U.S. Cl. .................... 365/205; 365/193; 365/207; 365/203
(58) Field of Classification Search .............. 365/205, 365/193, 207, 203
    See application file for complete search history.

(56) References Cited

U.S. PATENT DOCUMENTS

| | | | |
|---|---|---|---|
| 5,036,227 A | 7/1991 | Jo et al. | |
| 5,638,328 A | 6/1997 | Cho | |
| 5,835,449 A | 11/1998 | Lee | |
| 6,163,493 A * | 12/2000 | Yamagata et al. | 365/226 |
| 6,353,567 B1 * | 3/2002 | Huang et al. | 365/203 |
| 6,452,862 B1 * | 9/2002 | Tomotani | 365/230.06 |
| 7,616,511 B2 | 11/2009 | Kim | |
| 7,656,732 B2 * | 2/2010 | Kuroda | 365/207 |
| 2003/0095457 A1 | 5/2003 | Jeon et al. | |
| 2008/0316840 A1 | 12/2008 | Kim | |

FOREIGN PATENT DOCUMENTS

| | | |
|---|---|---|
| CN | 1627444 A | 6/2005 |
| CN | 1747066 A | 3/2006 |
| KR | 10-1999-0077852 A | 10/1999 |

* cited by examiner

*Primary Examiner*—Connie C Yoha
(74) *Attorney, Agent, or Firm*—John P. White; Cooper & Dunham LLP

(57) ABSTRACT

An input/output (I/O) line sense amplifier includes a buffer unit, a sense amplifier, and a precharge unit. The buffer unit is driven by a first level voltage to buffer a strobe signal, and the sense amplifier is driven by a second level voltage to amplify a signal of an I/O line in response to an output signal of the buffer unit. The precharge unit is driven by the first level voltage to precharge an output signal of the sense amplifier in response to the output signal of the buffer unit.

10 Claims, 6 Drawing Sheets

FIG.5

| | CONVENTIONAL ART | | EMBODIMENT 1 | | EMBODIMENT 2 | |
|---|---|---|---|---|---|---|
| | ΔV DO/DOB | Current @iostbp1 | ΔV DO/DOB | Current @iostbp1 | ΔV DO/DOB | Current @iostbp1 |
| FAST | 596mV | 1.33mA | 523mV | 782μA | 339mV | 762μA |
| TYPICAL | 717mV | 813μA | 658mV | 501μA | 529mV | 491μA |
| SLOW | 829mV | 460μA | 788mV | 290μA | 730mV | 291μA |
| SLOW2 | 151mV (FAIL!!) | 273μA | 594mV | 217μA | 750mV | 226μA |

INPUT/OUTPUT LINE SENSE AMPLIFIER AND SEMICONDUCTOR MEMORY DEVICE USING THE SAME

This application is a divisional of U.S. Ser. No. 12/004,228, filed Dec. 20, 2007 now U.S. Pat. No. 7,616,511, which claims priority of Korean Patent Application No. 10-2007-0062548, filed Jun. 25, 2007, the contents of which are hereby incorporated by reference into this application.

BACKGROUND

The present disclosure relates to a semiconductor memory device, and more particularly, to an input/output line sense amplifier configured to increase power efficiency of a semiconductor memory device by reducing an operating current.

Data input/output (I/O) lines are used for data transmission in a semiconductor memory device. An output signal of a bit line sense amplifier (BLSA) in a memory cell area (or core area) is transmitted to a global I/O line (GIO) via a local I/O line (LIO). In general, the global I/O line is globally disposed over a plurality of banks, and transmits data between a data I/O pad and a memory cell area.

A circuit is required for data transmission between the global I/O line and the local I/O line. In the case of a dynamic random access memory (DRAM), an I/O line sense amplifier (IOSA) is used in a read operation to amplify data carried on the local I/O line and transfer the amplified data to the global I/O line, and a write driver (WDRV) is used in a write operation to amplify data carried on the global I/O line and transfer the amplified data to the local I/O line.

Conventional I/O line sense amplifiers may be divided into a one-stage amplification type and a two-stage amplification type. First, the one-stage application type I/O line sense amplifier has a simple circuit configuration, which contributes to decreasing current consumption. However, since an offset characteristic of an input signal is deteriorated, a potential difference between data carried on local I/O lines (LIO and LIOB) must be high enough to sufficiently amplify the data and transmit the amplified data to a global I/O line. To this end, it is necessary to delay an enabling period of a strobe signal for driving the I/O line sense amplifier by a predetermined time, but in this case, a column address access time (tAA) undesirably increases.

The two-stage application type I/O line sense amplifier amplifies data of the local I/O lines (LIO and LIOB) by two stages. Amplification operations of the two stages are sequentially driven by separate strobe signals, thereby improving offset characteristics of an input signal. Thus, even if the potential difference between data of the local I/O lines (LIO and LIOB) is small, the data can be sufficiently amplified and then transmitted to the global I/O line.

BRIEF SUMMARY

This disclosure describes various improvements to configurations of input/output (I/O) line sense amplifiers. In one embodiment, an input/output (I/O) line sense amplifier includes a buffer unit driven by a first level voltage to buffer a strobe signal, a sense amplifier driven by a second level voltage to amplify a signal of an I/O line in response to an output signal of the buffer unit, and a precharge unit driven by the first level voltage to precharge an output signal of the sense amplifier in response to the output signal of the buffer unit.

The sense amplifier may generate a first amplified signal and a second amplified signal, and may output the first amplified signal and the second amplified signal to a first output line and a second output line, respectively.

The precharge unit may equalize voltages of the first and second output lines.

The precharge unit may include an equalizer connected between the first and second output lines to short-circuit the first and second output lines in response to the output signal of the buffer unit.

The equalizer may be a metal oxide semiconductor (MOS) transistor.

The buffer unit may include a logic element configured to perform a logic operation on the strobe signal and a control signal enabled to drive the sense amplifier, and a buffer driven by the first level voltage to buffer an output signal of the logic element.

The first level voltage may be a core voltage supplied to a cell core area.

The second level voltage may be a peripheral voltage supplied to a peripheral area, or a power voltage.

In another embodiment, an input/output (I/O) line sense amplifier, includes a buffer unit driven by a first level voltage to buffer a first strobe signal, a first sense amplifier driven by the first level voltage to amplify a signal of a first I/O line in response to an output signal of the buffer unit, a precharge unit driven by the first level voltage to precharge an output signal of the first sense amplifier in response to the output signal of the buffer unit, and a second sense amplifier driven by a second level voltage to amplify the output signal of the first sense amplifier in response to a second strobe signal to generate a driving signal for driving a second I/O line.

The first sense amplifier may include a differential amplifier configured to form a current mirror by a metal oxide semiconductor (MOS) transistor having a low threshold voltage.

The first I/O line may be a local I/O line, and the second I/O line may be a global I/O line.

In still another embodiment, a semiconductor memory device includes a memory cell array comprising a bit line sense amplifier, and an input/output (I/O) line sense amplifier comprising a buffer unit, a first sense amplifier, a precharge unit, and a second sense amplifier. The buffer unit is driven by a first level voltage to buffer a first strobe signal. The first sense amplifier is driven by a second level voltage to amplify a signal of the bit line sense amplifier transmitted to a first I/O line in response to an output signal of the buffer unit. The precharge unit is driven by the first level voltage to precharge an output signal of the first sense amplifier in response to the output signal of the buffer unit. The second sense amplifier is driven by the second level voltage to amplify the output signal of the first sense amplifier in response to a second strobe signal to generate a driving signal for driving a second I/O line. In addition, the semiconductor memory device includes a write driver configured to amplify a signal input to a data pad and transmitted through the second I/O line, and transmit the signal to the first I/O line.

BRIEF DESCRIPTION OF THE DRAWINGS

FIG. 5 illustrates a table for comparison of operating currents of a conventional I/O line sensor amplifier on the one hand and the I/O line sense amplifiers of FIGS. 1 and 3 on the other hand.

DETAILED DESCRIPTION OF EXEMPLARY EMBODIMENTS

Hereinafter, an I/O line sense amplifier and a semiconductor memory device using the same, in accordance with various embodiments and examples of the present invention, will be described in detail with reference to the accompanying drawings.

Figure 1:
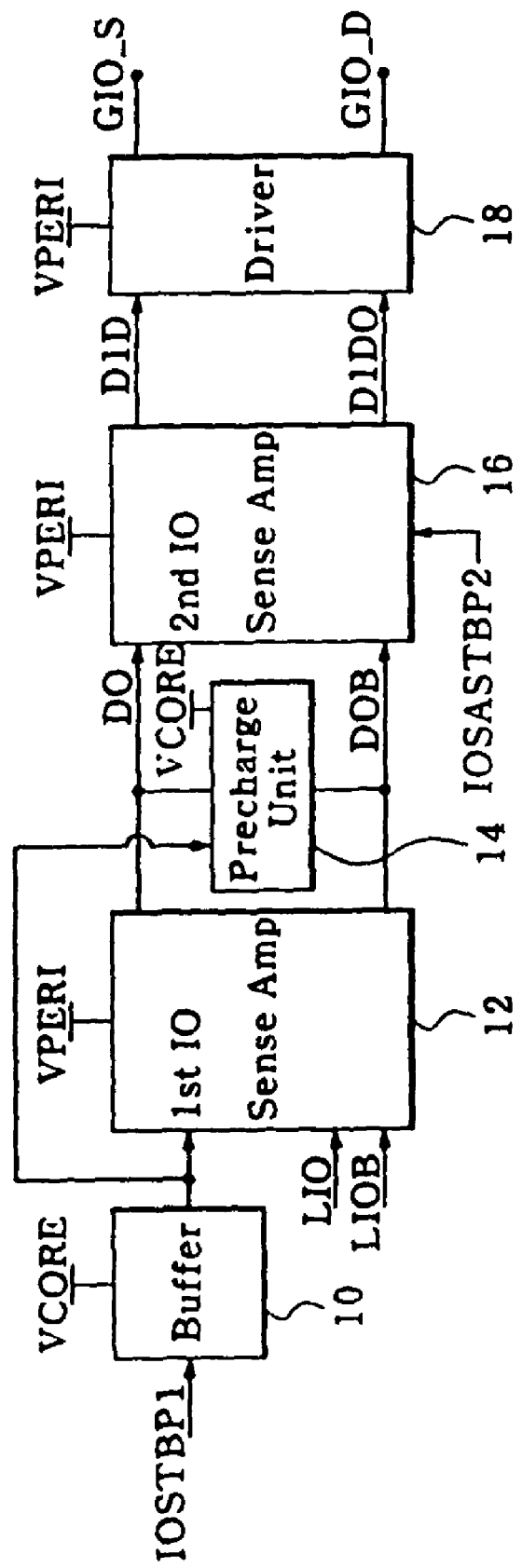
FIG. 1 illustrates a block diagram of an I/O line sense amplifier according to an exemplary embodiment of the present disclosure.
Figure 2:
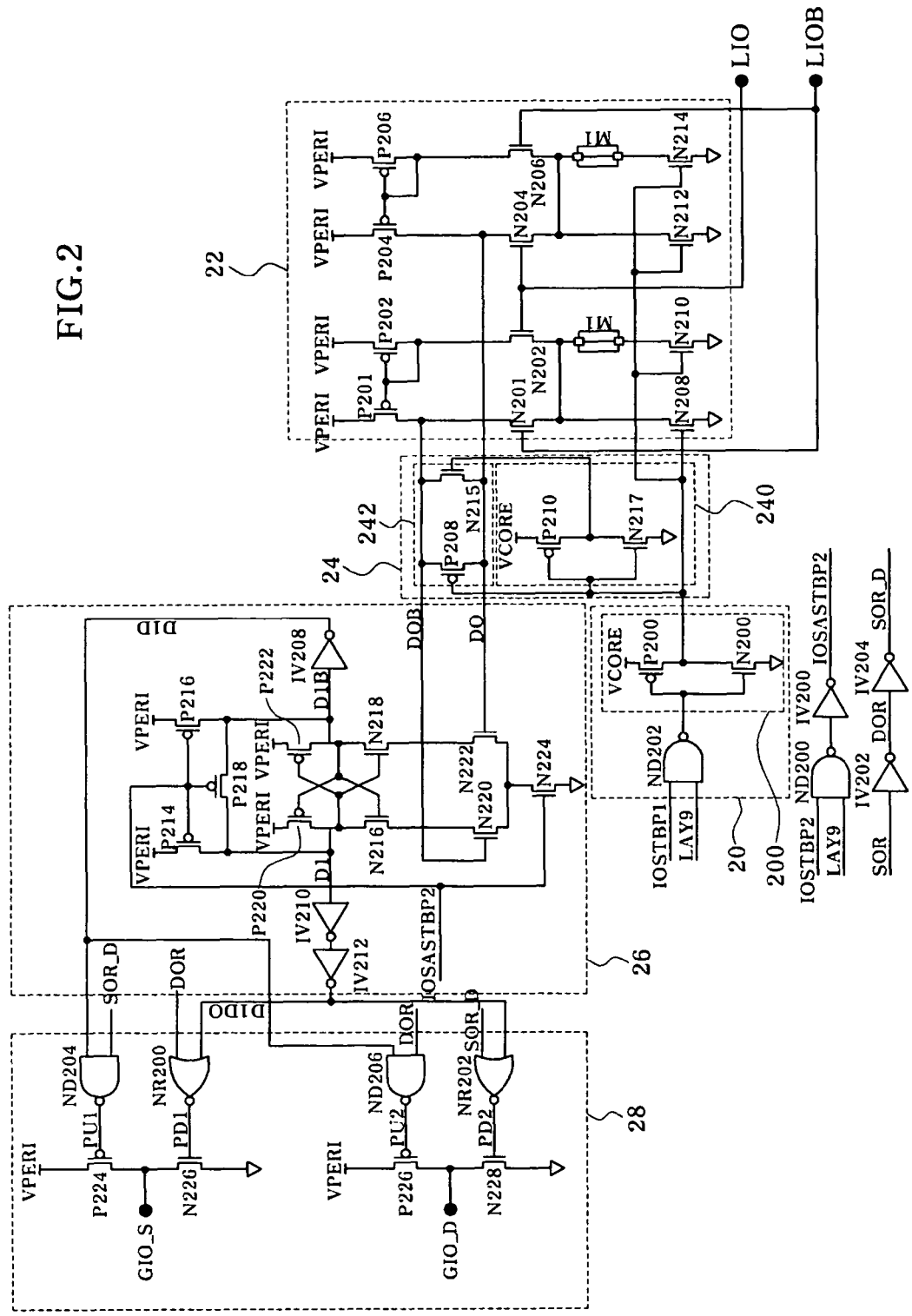
FIG. 2 illustrates a circuit diagram of the I/O line sense amplifier of FIG. 1.

FIG. 1 illustrates a block diagram of an I/O line sense amplifier according to one exemplary embodiment of the present disclosure, and FIG. 2 illustrates a circuit diagram of the I/O line sense amplifier of FIG. 1.

Referring to FIG. 1, an I/O line sense amplifier, according to one exemplary embodiment, includes a buffer unit 10, a first I/O line sense amplifier 12, a precharge unit 14, a second I/O line sense amplifier 16, and a driver 18. The buffer unit 10 buffers a first strobe signal IOSTBP1. The first I/O line sense amplifier 12 amplifies signals of local I/O lines LIO and LIOB in response to an output signal of the buffer unit 10. The precharge unit 14 equalizes output lines of a first amplified signal and its inverted signal D0 and D0B in response to the output signal of the buffer unit 10. The second I/O line sense amplifier 16 amplifies the first amplified signal and its inverted signal D0 and D0B in response to a second strobe signal IOSASTBP2 to generate driving signals D1D and D1D0. The driver 18 drives signals of global I/O lines GIO_S and GIO_D in response to the driving signals D1D and D1D0. Here, the buffer unit 10 and the precharge unit 14 are driven by a core voltage VCORE, and the first I/O line sense amplifier 12, the second I/O line sense amplifier 16, and the driver 18 are driven by a peripheral voltage VPERI or a power voltage VDD.

A circuit configuration of an I/O line sense amplifier, according to an exemplary embodiment, will now be described in more detail with reference to FIG. 2. A buffer unit 20 includes a NAND gate ND202, and a first buffer unit 200. The NAND gate ND202 is configured to perform a NAND operation on a first strobe signal IOSTBP1 and a control signal LAY9. The first buffer unit 200 is driven by a core voltage VCORE to invert and buffer an output signal of the NAND gate ND202. The first strobe signal IOSTBP1 and the control signal LAY9 are signals enabled to a "high" level for driving a first I/O line sense amplifier 22.

The first I/O line sense amplifier 22 includes p-type metal oxide semiconductor (PMOS) transistors P201-P202 and P204-P206, n-type metal oxide semiconductor (NMOS) transistors N201, N202, N204 and N206, and NMOS transistors N208, N210, N212 and N214. The PMOS transistors P201-P202 and P204-P206 are driven by a peripheral voltage VPERI to form a current mirror. The NMOS transistors N201, N202, N204 and N206 are configured to receive signals of local I/O lines LIO and LIOB for differential amplification. The NMOS transistors N208, N210, N212 and N214 are configured to receive an output signal of the buffer unit 20 to enable differential amplification.

A precharge unit 24 includes a second buffer 240, and a transfer gate 242. The second buffer 240 is driven by the core voltage VCORE to invert and buffer an output signal of the buffer unit 20. The transfer gate 242 includes a PMOS transistor P208 and an NMOS transistor N215 configured to short-circuit output lines of a first amplified signal and its inverted signal D0 and D0B in response to the output signal of the buffer unit 20 and its inverted signal.

The second I/O line sense amplifier 26 is configured as a cross-coupled amplifier to differentially amplify the first amplified signal and its inverted signal D0 and D0B to generate a second amplified signal and its inverted signal D1 and D1B. The second I/O line sense amplifier 26 includes inverters IV208, IV210 and IN212 configured to buffer the second amplified signal and its inverted signal D1 and D1B to generate driving signals D1D and D1D0.

A driver 28 includes a NAND gate ND204, a NAND gate ND206, a NOR gate NR200, a NOR gate NR202, a PMOS transistor P224, an NMOS transistor N226, a PMOS transistor P226, and an NMOS transistor N228. The NAND gate ND204 is configured to perform a NAND operation on the driving signal D1D and a control signal SOR_D to generate a first pull-up signal PU1. The NAND gate ND206 is configured to perform a NAND operation on the driving signal D1D and a control signal DOR to generate a second pull-up signal PU2. The NOR gate NR200 is configured to perform a NOR operation on the driving signal D1D0 and a control signal DOR to generate a first pull-down signal PD1. The NOR gate NR202 is configured to perform a NOR operation on the driving signal D1D0 and a control signal SOR_D to generate a second pull-down signal PD2. The PMOS transistor P224 is configured to pull up a global I/O line GIO_S in response to the first pull-up signal PU1. The NMOS transistor N226 is configured to pull down the global I/O line GIO_S in response to the first pull-down signal PD1. The PMOS transistor P226 is configured to pull up a global I/O line GIO_D in response to the second pull-up signal PU2. The NMOS transistor N228 is configured to pull down the global I/O line GIO_D in response to the second pull-down signal PD2.

As described above, in the I/O line sense amplifier according to the exemplary embodiment of FIG. 2, the first buffer 200 and the second buffer 240 are driven by the core voltage VCORE. Accordingly, a voltage supplied to the NMOS transistors N208, N210, N212 and N214 is reduced, thereby reducing an operating current. The operating current of the first I/O line sense amplifier 22 can be reduced by approximately 60% as compared to the case where a peripheral voltage VPERI or a power voltage VDD is supplied.

The I/O line sense amplifier according to the exemplary embodiment of FIG. 2 includes the transfer gate 242 configured to short-circuit output lines of the first amplified signal and its inverted signal D0 and D0B in response to the output signal of the buffer unit 20 and its inverted signal, so that a leakage current path is prevented from being formed from the first I/O line sense amplifier 22 to the precharge unit 24. This will now be described in more detail. The first I/O line sense amplifier 22 is driven by the peripheral voltage VPERI, and the precharge unit 24 is driven by the core voltage VCORE. Since the first I/O line sense amplifier 22 and the precharge unit 24 are driven by different kinds of voltages, a leakage current path may be formed from the first I/O line sense amplifier 22 to the precharge unit 24. Therefore, the I/O line sense amplifier according to the exemplary embodiment of FIG. 2 includes the transfer gate 242 to obviate the formation of the current path between the first I/O line sense amplifier 22 and the precharge unit 24.

Figure 3:
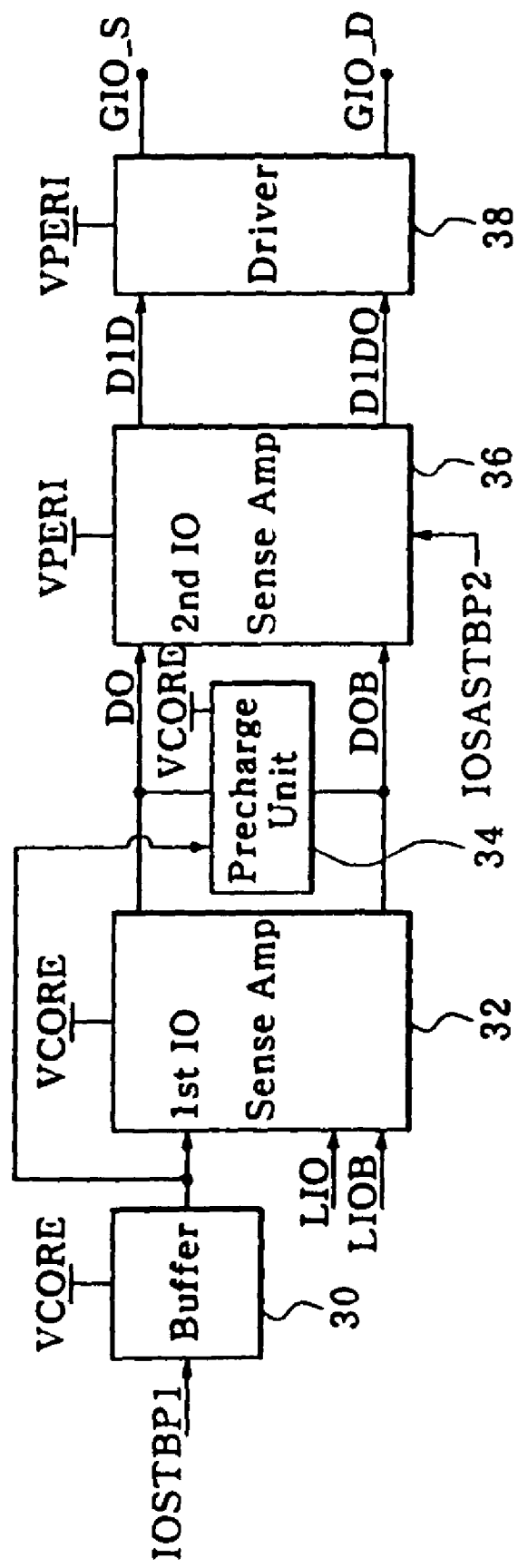
FIG. 3 illustrates a block diagram of an I/O line sense amplifier according to another embodiment of the present disclosure.
Figure 4:
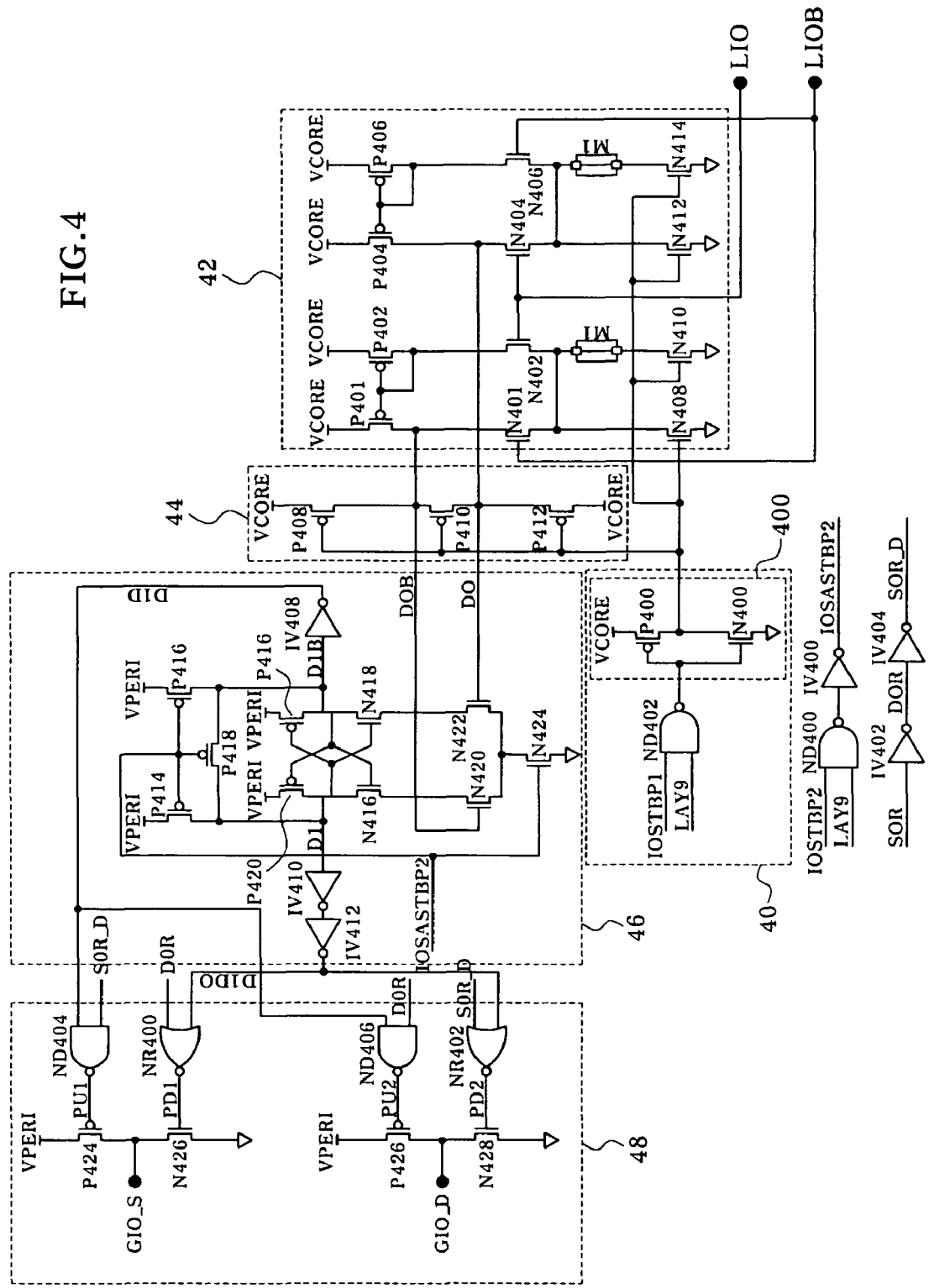
FIG. 4 illustrates a circuit diagram of the I/O line sense amplifier of FIG. 3.

FIG. 3 illustrates a block diagram of an I/O line sense amplifier according to another exemplary embodiment of the present disclosure, and FIG. 4 illustrates a circuit diagram of the I/O line sense amplifier of FIG. 3.

Referring to FIG. 3, the I/O line sense amplifier according to another exemplary embodiment of the present disclosure includes a buffer unit 30, a first I/O line sense amplifier 32, a precharge unit 34, a second I/O line sense amplifier 36, and a driver 38. The buffer unit 30 buffers a first strobe signal IOSTBP1. The first I/O line sense amplifier 32 amplifies signals of local I/O lines LIO and LIOB in response to an output signal of the buffer unit 30. The precharge unit 34 precharges output lines of a first amplified signal and its inverted signal D0 and D0B with a core voltage VCORE in response to the output signal of the buffer unit 30. The second I/O line sense amplifier 36 amplifies the first amplified signal and its inverted signal D0 and D0B in response to a second strobe signal IOSASTBP2 to generate driving signals D1D and D1D0. The driver 38 drives signals of global I/O lines GIO_S and GIO_D in response to the driving signals D1D and D1D0. The buffer unit 30, the first I/O line sense amplifier 32, and the precharge unit 34 are driven by a core voltage VCORE, and the second I/O line sense amplifier 36 and the driver 38 are driven by a peripheral voltage VPERI.

Referring to FIG. 4, a buffer unit 40 includes a NAND gate ND402, and a third buffer 400. The NAND gate ND402 is configured to perform a NAND operation on a first strobe signal IOSTBP1 and a control signal LAY9. The third buffer 400 is driven by a core voltage VCORE to invert and buffer an output signal of the NAND gate ND402.

A first I/O line sense amplifier 42 includes PMOS transistors P401-P402 and P404-P406, NMOS transistors N401, N402, N404 and N406, and NMOS transistors N408, N410, N412 and N414. The PMOS transistors P401-P402 and P404-P406 are driven by the core voltage VCORE to form a current mirror. The NMOS transistors N401, N402, N404 and N406 are configured to receive signals of local I/O lines LIO and LIOB for differential amplification. The NMOS transistors N408, N410, N412 and N414 are configured to receive an output signal of the buffer unit 40 to enable the differential amplification. Unlike the conventional art, since the first I/O line sense amplifier 42 is driven by a core voltage VCORE having a lower level than a peripheral voltage VPERI, the PMOS transistors P401-P402 and P404-P406 may have a low threshold voltage so that smooth operations can be achieved at a low power-voltage (VDD) level.

The precharge unit 44 includes PMOS transistors P408, P410 and P412 configured to precharge output lines of an amplified signal and its inverted signal D0 and D0B with a core voltage VCORE in response to an output signal of the buffer unit 40.

As described above, in the I/O line sense amplifier according to the exemplary embodiment of FIG. 4, the buffer unit 40, the first sense amplifier 42, and the precharge unit 44 are driven by a core voltage VCORE having a lower level than a power voltage VDD or a peripheral voltage VPERI. Accordingly, an operating current can be reduced.

As can be seen from the table of FIG. 5, when the I/O line sense amplifiers of FIGS. 1 and 3 are used, a potential difference ΔV between an first amplified signal and its inverted signal D0 and D0B increases as compared to a conventional I/O line sense amplifier, and an operating current Current@iostbp1 in a first I/O line sense amplifier decreases. That is, fail occurs in the conventional I/O line sense amplifier because a potential difference ΔV between a first amplified signal and its inverted signal D0 and D0B is no more than 151 mV in a state where skew is slow2. However, sufficient amplification is achieved in the I/O line sense amplifiers of FIGS. 1 and 3 because potential differences ΔV are respectively 594 mV and 750 mV, which are sufficiently high. Also, when the I/O line sense amplifiers of FIGS. 1 and 3 are used, the operating current Current@iostbp1 consumed by each first I/O line sense amplifier remarkably decreases under every skew condition as compared to the conventional art.

Figure 6:
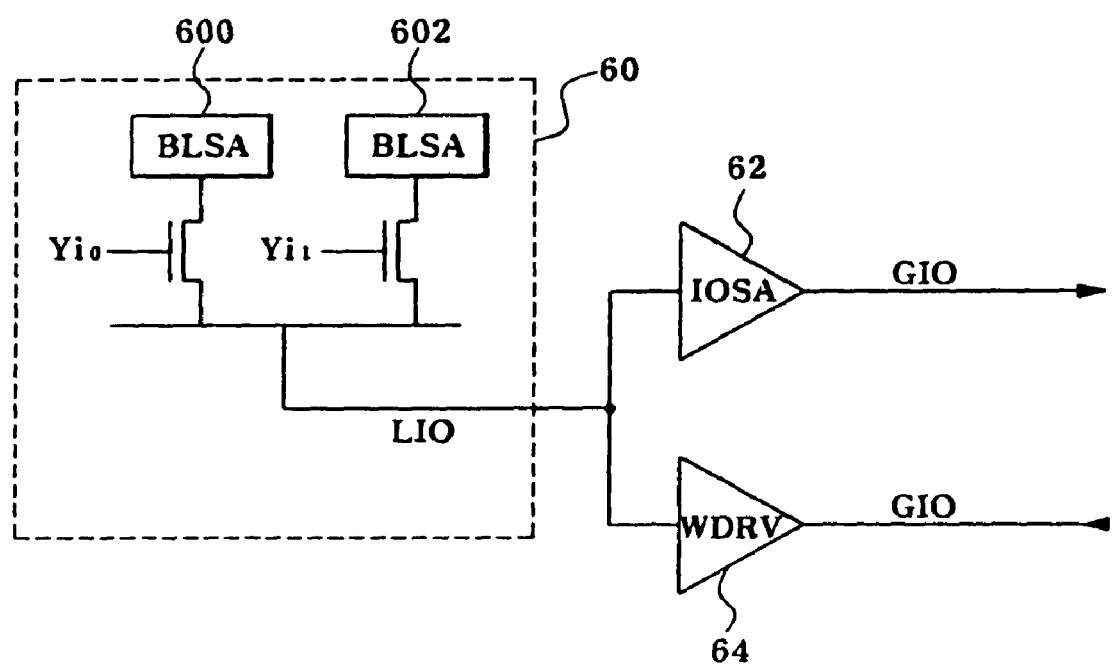
FIG. 6 illustrates a block diagram of a semiconductor memory device employing the I/O line sense amplifier of FIG. 1 or 3 according to an exemplary embodiment of the present disclosure.

FIG. 6 illustrates a block diagram of a semiconductor memory device employing one of the I/O line sense amplifiers of FIGS. 1 and 3 according to an exemplary embodiment of the present disclosure.

Referring to FIG. 6, the semiconductor memory device according to an exemplary embodiment includes a memory cell array 60 including bit line sense amplifiers BLSA 600 and 602, an I/O line sense amplifier IOSA 62, and a write driver 64. The I/O line sense amplifier 62 amplifies data carried on a local I/O line LIO and transmits the data to a global I/O line GIO in a read operation. The write driver 64 amplifies data carried on the global I/O line GIO and transmits the data to the local I/O line LIO in a write operation. The I/O line sense amplifier IOSA 62 may be one of the I/O line sense amplifier of FIG. 1 and 2, and the I/O line sense amplifier of FIGS. 3 and 4. Accordingly, in the semiconductor memory device according to the exemplary embodiment of FIG. 6, an operating current of the I/O line sense amplifier 62 decreases, so that power consumption can be reduced.

The I/O line sense amplifiers of this disclosure are usable in virtually every semiconductor memory device, and are also usable in a universal integrated circuit (IC). Thus, reducing an operating current of the I/O line sense amplifier (IOSA) may contribute to greatly improving power efficiency of the semiconductor memory device. For example, reduction of an operating current of the I/O line sense amplifier (IOSA) will be a great help to mobile devices, one of the main concerns of which is to improve power efficiency.

While the subject matter of this disclosure has been described with respect to specific exemplary embodiments and examples, it will be apparent to those skilled in the art that various changes and modifications may be made without departing from the spirit and scope of the invention as defined in the following claims.

The present application claims priority to Korean patent application number 10-2007-0062548, filed on Jun. 25, 2007, which is incorporated by reference in its entirety herein.

What is claimed is:

1. A semiconductor memory device comprising:
a memory cell array comprising a bit line sense amplifier;
an input/output (I/O) line sense amplifier comprising a buffer unit, a first sense amplifier, a precharge unit, and a second sense amplifier, wherein
the buffer unit is driven by a first level voltage to buffer a first strobe signal,
the first sense amplifier is driven by a second level voltage to amplify a signal of the bit line sense amplifier transmitted to a first I/O line in response to an output signal of the buffer unit,
the precharge unit is driven by the first level voltage to precharge an output signal of the first sense amplifier in response to the output signal of the buffer unit, and
the second sense amplifier is driven by the second level voltage to amplify the output signal of the first sense amplifier in response to a second strobe signal to generate a driving signal for driving a second I/O line; and a write driver configured to amplify a signal, the signal being input to a data pad and transmitted through the second I/O line, and transmit the signal to the first I/O line.

2. The device of claim 1, wherein the first sense amplifier generates a first amplified signal and a second amplified signal, and outputs the first amplified signal and the second amplified signal to a first output line and a second output line, respectively.

3. The device of claim 2, wherein the precharge unit equalizes voltages of the first and second output lines.

4. The device of claim 3, wherein the precharge unit comprises an equalizer connected between the first and second output lines to short-circuit the first and second output lines in response to the output signal of the buffer unit.

5. The device of claim 4, wherein the equalizer is a metal oxide semiconductor (MOS) transistor.

6. The device of claim 1, wherein the buffer unit comprises:
a logic element configured to perform a logic operation on the first strobe signal and a control signal enabled to drive the first sense amplifier; and
a first buffer driven by the first level voltage to buffer an output signal of the logic element.

7. The device of claim 1, wherein the first level voltage is a core voltage supplied to a cell core area.

8. The device of claim 1, wherein the second level voltage is a peripheral voltage supplied to a peripheral area, or a power voltage.

9. The device of claim 1, wherein the first I/O line is a local I/O line.

10. The device of claim 1, wherein the second I/O line is a global I/O line.

* * * * *